(12) United States Patent
Suresh et al.

(10) Patent No.: US 10,468,574 B2
(45) Date of Patent: Nov. 5, 2019

(54) THERMOELECTRIC MATERIALS AND RELATED COMPOSITIONS AND METHODS

(71) Applicant: Baker Hughes, a GE company, LLC, Houston, TX (US)

(72) Inventors: Radhika Suresh, Sugar Land, TX (US); Oleksandr V. Kuznetsov, Manvel, TX (US); Valery N. Khabashesku, Houston, TX (US)

(73) Assignee: Baker Hughes, a GE company, LLC, Houston, TX (US)

(*) Notice: Subject to any disclaimer, the term of this patent is extended or adjusted under 35 U.S.C. 154(b) by 142 days.

(21) Appl. No.: 15/586,945

(22) Filed: May 4, 2017

(65) Prior Publication Data

US 2018/0342660 A1    Nov. 29, 2018

(51) Int. Cl.
| | |
|---|---|
| *H01L 35/26* | (2006.01) |
| *C08K 9/02* | (2006.01) |
| *C08K 3/04* | (2006.01) |
| *H01L 35/34* | (2006.01) |
| *H01L 35/30* | (2006.01) |
| *H01L 51/00* | (2006.01) |

(Continued)

(52) U.S. Cl.
CPC .............. *H01L 35/26* (2013.01); *C08K 3/041* (2017.05); *C08K 3/042* (2017.05); *C08K 9/02* (2013.01); *H01L 35/24* (2013.01); *H01L 35/30* (2013.01); *H01L 35/34* (2013.01); *H01L 51/0049* (2013.01); *C08K 2201/001* (2013.01); *C08K 2201/011* (2013.01); *E21B 47/00* (2013.01)

(58) Field of Classification Search
CPC .......... H01L 35/22; C09K 3/041; C09K 3/042
See application file for complete search history.

(56) References Cited

U.S. PATENT DOCUMENTS

| | | |
|---|---|---|
| 5,472,519 A | 12/1995 | Howell et al. |
| 5,973,050 A | 10/1999 | Johnson et al. |

(Continued)

FOREIGN PATENT DOCUMENTS

| | | | |
|---|---|---|---|
| WO | WO 2016/076649 | * | 5/2016 |
| WO | WO 2017/122805 | * | 7/2017 |

OTHER PUBLICATIONS

International Written Opinion for International Application No. PCT/US2018/030585 dated Sep. 5, 2018, 6 pages.

(Continued)

*Primary Examiner* — C Melissa Koslow
(74) *Attorney, Agent, or Firm* — TraskBritt

(57) ABSTRACT

A thermoelectric material includes a polymer matrix and a plurality of partially coated particles dispersed within the polymer matrix. Each particle of the plurality has a discontinuous coating of metal on a carbon-based material. A method includes dispersing functionalized particles comprising a carbon-based material in a solvent; providing a metal salt in the solvent; and forming a plurality of distinct metal volumes on a surface of the functionalized particles to form partially coated particles. The distinct metal volumes are thermally insulated from other volumes of the plurality. A composition of matter includes a discontinuous coating of metal on a surface of a carbon-based material. The carbon-based material is selected from the group consisting of graphene oxide and functionalized carbon nanotubes.

8 Claims, 4 Drawing Sheets

(51) Int. Cl.
*H01L 35/24* (2006.01)
*E21B 47/00* (2012.01)

(56) References Cited

U.S. PATENT DOCUMENTS

| | | | |
|---|---|---|---|
| 6,710,238 B1 | 3/2004 | Shingu et al. | |
| 8,057,596 B2 | 11/2011 | Yoon et al. | |
| 8,865,501 B2 | 10/2014 | Kim | |
| 8,871,821 B2 | 10/2014 | Wang et al. | |
| 9,595,654 B2 * | 3/2017 | Roy | H01L 35/26 |
| 2003/0097845 A1 | 5/2003 | Saunders et al. | |
| 2008/0277162 A1 | 11/2008 | DiFoggio | |
| 2011/0186956 A1 | 8/2011 | Hiroshige et al. | |
| 2012/0291454 A1 | 11/2012 | Kahler et al. | |
| 2014/0338715 A1 | 11/2014 | Grunlan et al. | |
| 2014/0345661 A1 * | 11/2014 | Roy | H01L 35/26 |
| | | | 136/201 |
| 2015/0380625 A1 | 12/2015 | Freer et al. | |
| 2016/0083860 A1 | 3/2016 | Monteiro et al. | |
| 2017/0110643 A1 | 4/2017 | Choa et al. | |
| 2018/0108449 A1 * | 4/2018 | Kim | H01L 35/20 |
| 2019/0013454 A1 * | 1/2019 | Toshima | B82Y 30/00 |

OTHER PUBLICATIONS

International Search Report for International Application No. PCT/US2018/030585 dated Sep. 5, 2018, 3 pages.

Shahriary et al., Graphene Oxide Synthesized by Using Modified Hummers Approach, International Journla of Renewable Energy and Environmental Engineering, vol. 02, No. 01, Jan. 2004, pp. 58-63.

Yu et al., Light-Weight Flexible Carbon Nanotube Based Organic Composites with Large Thermoelectric Power Factors, ACS Nano, vol. 5, No. 10, Sep. 7, 2011, pp. 7885-7892.

* cited by examiner

THERMOELECTRIC MATERIALS AND RELATED COMPOSITIONS AND METHODS

FIELD

Embodiments of the present disclosure relate generally to materials exhibiting thermoelectric properties and methods and compositions related to such materials.

BACKGROUND

Thermoelectric materials are materials that change temperature when an electric current is passed through them. Thermoelectric materials may be formed from a variety of semiconductor materials, and may be characterized in terms of the material's thermoelectric efficiency ZT or "figure of merit" at a temperature, which is defined by the relation:

$$ZT = \frac{S^2 \sigma}{k} T,$$

Where S is the material's Seebeck coefficient; $\sigma$ is the material's electrical conductivity; k is the material's thermal conductivity; and T is the temperature. The Seebeck coefficient is approximated as a voltage difference between two ends of a sample of thermoelectric material divided by a temperature difference between the two ends:

$$S = \frac{\Delta V}{\Delta T}.$$

High Seebeck coefficients and electrical conductivity, coupled with low thermal conductivity, yield a high thermoelectric efficiency. Unfortunately, in many conventional thermoelectric materials, increases in Seebeck coefficient are associated with reduction in electrical conductivity and vice versa. Furthermore, electrical and thermal conductivity tend to be positively correlated, making it difficult to find materials having both a high electrical conductivity and a low thermal conductivity.

In underground drilling applications, such as oil and gas or geothermal drilling, a borehole is drilled through a subterranean formation, often deep into the earth. Such bore holes are drilled or formed by a drill bit connected to the end of a series of sections of drill pipe, so as to form an assembly commonly referred to as a "drill string." The drill string extends from the surface to the bottom of the borehole. As the drill bit rotates under an applied axial force, commonly termed "weight on bit," it advances into the earth, thereby forming the borehole. In order to lubricate the drill bit and flush cuttings from the drill bit's path as it advances, a high pressure solids-laden fluid, referred to as "drilling mud," is directed through an internal passage in the drill string and out through the drill bit. The drilling mud then flows to the surface through an annular passage formed between the exterior of the drill string and the surface or interior wall of the bore hole.

The distal or bottom end of the drill string, which includes the drill bit, is referred to as a "downhole assembly." In addition to the drill bit, the downhole assembly often includes specialized modules or tools within the drill string that make up an electrical system for the drill string. Such modules often include sensing modules. In many applications, the sensing modules provide the drill string operator with information regarding the formation as it is being drilled through, using techniques commonly referred to as "measurement while drilling" (MWD) or "logging while drilling" (LWD). For example, resistivity sensors may be used to transmit and receive high frequency signals (e.g., electromagnetic waves) that travel through the formation surrounding the sensor.

As can be readily appreciated, such an electrical system may include many sophisticated electronic components, such as the sensors themselves, which in many cases include printed circuit boards. Additional associated components for storing and processing data in the control module may also be included on the printed circuit boards. Unfortunately, many of these electronic components generate heat. Even if the electronic component itself does not generate heat, the temperature of the formation itself, particularly in deep boreholes and in geothermal wells, may exceed the maximum temperature capability of the components (which may be about 150° C.

Overheating downhole frequently results in failure or reduced life expectancy for thermally stressed electronic components. Consequently, cooling of the electronic components can be important. Unfortunately, cooling is made difficult by the fact that the temperature of the formation surrounding deep wells, especially geothermal wells, is typically relatively high, and may exceed 200° C.

Downhole tools are exposed to tremendous thermal strain. The metal downhole tool housing is in direct thermal contact with the borehole drilling fluids and conducts heat from the borehole drilling fluid into the downhole tool housing. Conduction of heat into the tool housing raises the ambient temperature inside of the electronics chamber. Thus, the thermal load on a non-insulated downhole tool's electronic system is enormous and can lead to electronic failure. Electronic failure is time consuming and expensive. In the event of electronic failure, downhole operations must be interrupted while the downhole tool is removed from deployment and repaired.

BRIEF SUMMARY

In some embodiments, thermoelectric material includes a polymer matrix and a plurality of partially coated particles dispersed within the polymer matrix. Each particle of the plurality has a discontinuous coating of metal on a carbon-based material.

A method includes dispersing functionalized particles comprising a carbon-based material in a solvent; providing a metal salt in the solvent; and forming a plurality of distinct metal volumes on a surface of the functionalized particles to form partially coated particles. The distinct metal volumes are thermally insulated from other volumes of the plurality.

A composition of matter includes a discontinuous coating of metal on a surface of a carbon-based material. The carbon-based material is selected from the group consisting of graphene oxide and functionalized carbon nanotubes.

DETAILED DESCRIPTION

The illustrations presented herein are not actual views of any particular material, but are merely idealized representations that are employed to describe example embodiments of the present disclosure. Additionally, elements common between figures may retain the same numerical designation.

Figure 1:
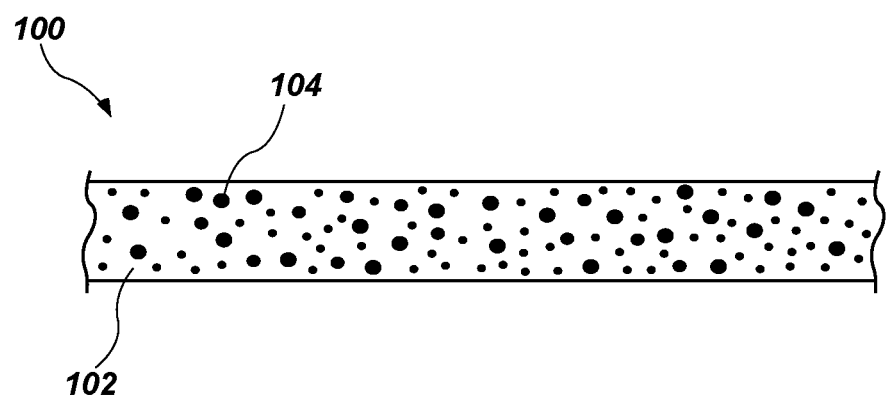
FIG. 1 is a simplified cross-sectional side view illustrating an embodiment of a thermoelectric material according to the present disclosure.

FIG. 1 illustrates a thermoelectric material 100 having a polymer matrix 102 and a plurality of partially coated particles 104 dispersed within the polymer matrix 102.

The polymer matrix 102 may be a material such as polyether ether ketone (PEEK), polyethylene (PE), polyethylene terephthalate (PET), polyvinyl chloride (PVC), polyurethane (PU), poly(methyl methacylate) (PMMA), etc., which may be selected based on density, thermal conductivity, method of curing, etc.

Figure 2:
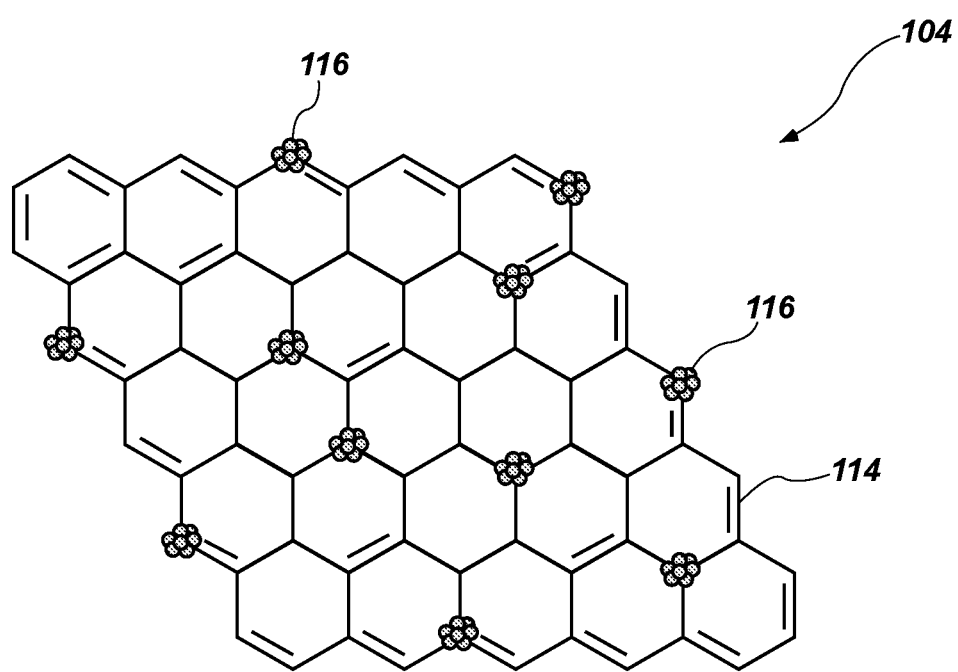
FIG. 2 is a simplified diagram illustrating a molecular structure of some particles disclosed herein.

Each of the partially coated particles 104 may have a discontinuous coating of metal over a carbon-based material. For example, as shown in FIG. 2, the partially coated particles 104 may include graphene oxide 114. The graphene oxide 114 may have a metal 116 formed over portions of the graphene oxide 114. The metal 116 may include any metal formulated to conduct heat, such as nickel, cobalt, copper, silver, platinum, palladium, chromium, tantalum, antimony, iron, tin, gold, etc., and alloys and combinations thereof. The portions of the metal 116 may be thermally insulated from one another. That is, there may be no metal-to-metal contact between distinct portions of the metal 116, but each portion of the metal 116 may be electrically connected to others via the graphene oxide 114 on which the metal 116 is disposed. Because the portions of the metal 116 do not contact other portions of the metal 116, heat may not tend to flow easily from one disconnected portion of the metal 116 to another. Therefore, the partially coated particles 104 may have relatively lower thermal conductivity than similar particles entirely coated with metal.

Because the portions of the metal 116 are electrically connected to other portions of the metal 116 via the graphene oxide 114, electrons may tend to flow easily from one disconnected portion of the metal 116 to another. Therefore, the partially coated particles 104 may have relatively high electrical conductivity, which may be similar to the electrical conductivity of particles entirely coated with metal.

As another example, the partially coated particles 104 may include functionalized carbon nanotubes. In other embodiments, the partially coated particles 104 may include any other carbon-containing material, such as nanodiamond, amorphous carbon, carbon black, buckminsterfullerenes, etc. Whatever the carbon form, a metal 116 may formed over portions thereof.

The partially coated particles 104 may have an average largest linear dimension from about 1 nm to about 500 μm, such as from about 10 nm to about 50 μm, or from about 50 nm to about 10 μm. The disconnected portions of the metal 116 may have an average largest linear dimension from about 0.1 nm to about 500 nm, such as from about 0.5 nm to about 100 nm, or from about 1 nm to about 50 nm. The partially coated particles 104 may be from about 0.1% to about 20% volume of the thermoelectric material 100, such as from about 0.5% to about 10%, or from about 1% to about 5%.

To form the partially coated particles 104 (FIG. 1), functionalized carbon-based particles may be dispersed in a solvent, a metal salt may be provided in the solvent, and distinct portions of the metal 116 (FIG. 2) may be formed on a surface of the functionalized carbon-based particles.

Figure 3:
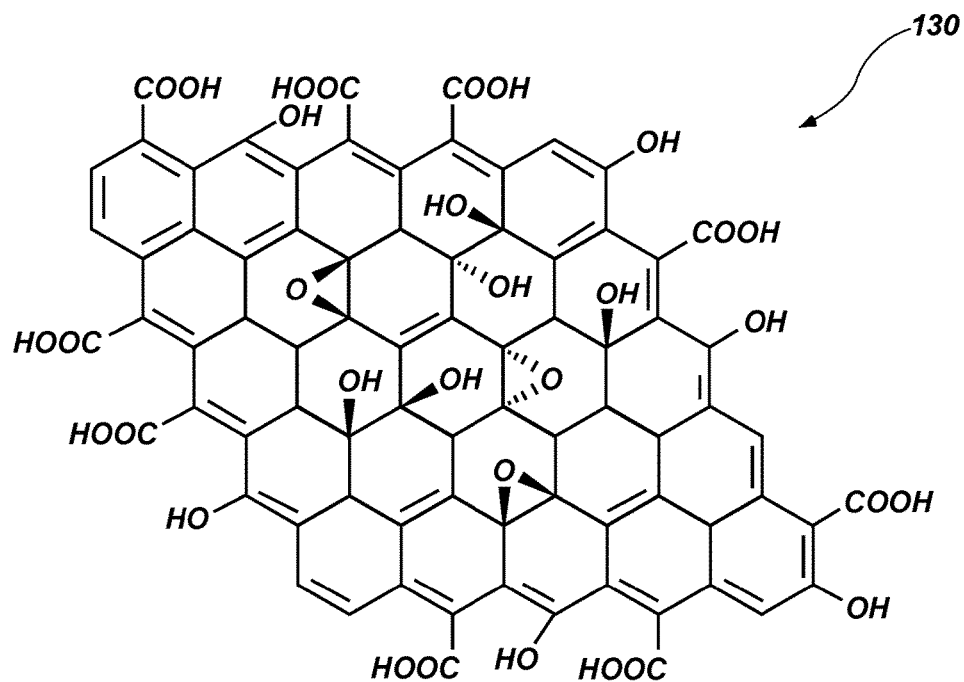
FIGS. 3 and 4 are simplified diagrams illustrating molecular structures of materials that may be used to form the particles shown in FIG. 2.

FIG. 3 illustrates a sheet of graphene oxide 130. The graphene oxide 130 includes a sheet of carbon atoms generally bonded to other carbon atoms in a structure of interlocking rings. Though shown and described as a "sheet," the graphene oxide 130 need not be planar. Graphene oxide is described generally in U.S. Pat. No. 8,871,821, "Graphene and Graphene Oxide Aerogels," issued Oct. 28, 2014, the entire disclosure of which is hereby incorporated herein by this reference. As illustrated in FIG. 3, the graphene oxide 130 may include hydroxyl groups (—OH), carboxyl groups (—COOH) and/or epoxy groups (—O—), or any other oxygen-containing functionalization. The functionalization on the graphene oxide 130 may be on some but not all of the carbon atoms. In general, the carbon atoms that are functionalized may be those to which metal 116 (FIG. 2) will be subsequently attached. Therefore, to form a partial coating having distinct portions of the metal 116, the graphene oxide 130 may have distinct areas that are functionalized, and other areas that are not functionalized.

The functionalized carbon-based particles may be dispersed in a solvent, such as water (e.g., deionized water), an acid, a base, an organic solvent, etc. Due to the presence of hydroxyl groups, carboxyl groups, and/or epoxy groups, the functionalized carbon-based particles may disperse relatively easily in aqueous solutions. The solvent may be stirred or otherwise mixed to suspend the functionalized carbon-based particles throughout the solvent. In some embodiments, the solvent may be subjected to ultrasonic energy to enhance dispersion of the functionalized carbon-based particles.

The solvent may be provided with a metal salt, which may be added before or after the functionalized carbon-based particles are dispersed. In some embodiments, the metal salt is dissolved in the solvent prior to adding the functionalized carbon-based particles. In other embodiments, the metal salt may be added after the functionalized carbon-based particles are mixed with the solvent. The metal salt may be dissolved or suspended in the solvent. The metal salt may be any metal salt containing the metal to be deposited, such as nitrates, sulfides, sulfates, sulfites, chlorides, bromides, chlorates, perchlorates, phosphates, etc. For example, the metal salt may be $NiCl_2$, $NiSO_4$, $CoCl_2$, $CoSO_4$, $Cu(NO_3)_2$, $AgNO_3$, AgCl, etc. The metal salt may selected based in part on its solubility in the solvent.

Figure 4:
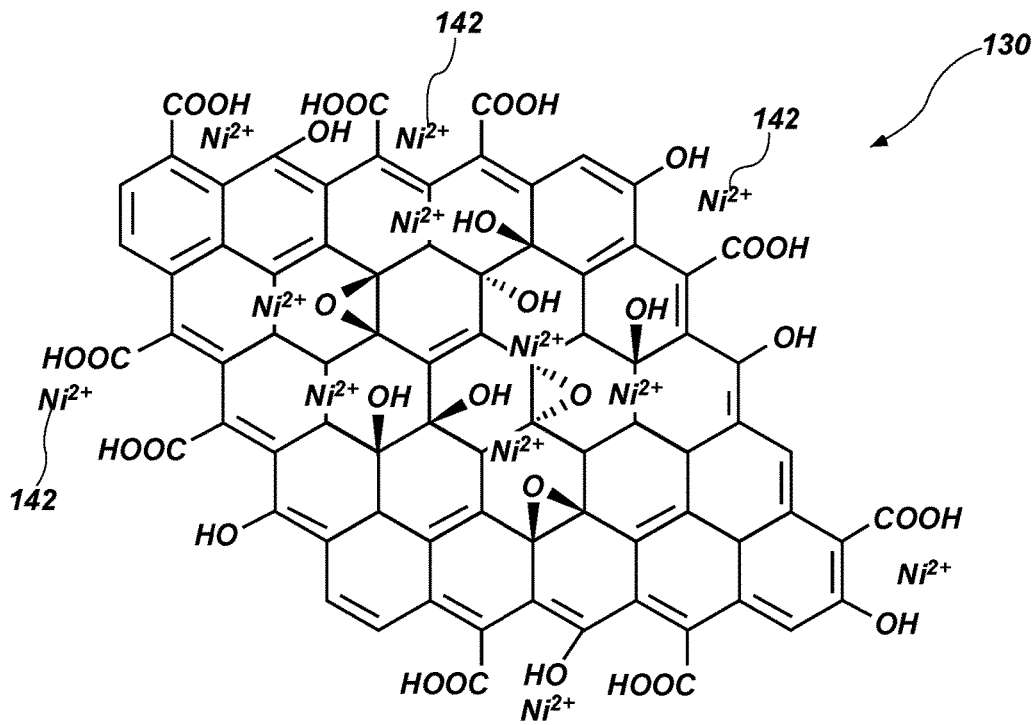

Metal cations from the metal salt may react with, be attracted to, adsorbed to, or be weakly bound to functional groups on the functionalized carbon-based particles. For example, if the functionalized carbon-based particles are graphene oxide 130, as shown in FIG. 3, metal cations from the metal salt may be attracted to the functionalized areas. FIG. 4 illustrates the attraction of metal cations 142 ($Ni^{2+}$) to the functional groups of the graphene oxide 130. The metal cations 142 may be attracted to some or all of the functional groups on the graphene oxide 130.

The metal cations 142 may form distinct volumes of metal on the surface of the functionalized carbon-based particles (e.g., the graphene oxide 130). For example, the metal cations 142 may be reduced, such as from $Ni^{2+}$ to Ni, $Cu^{2+}$ to Cu, $Ag^+$ to Ag, or $Co^{2+}$ to Co. In some embodiments, the metal cations 142 may be reduced and deposited by electroless deposition, reaction with a reducing agent, etc. Electroless deposition methods are described in U.S. Patent Application Publication 2016/0083860, "Methods of Coating Substrates with Composite Coatings of Diamond Nanoparticles and Metal," published Sep. 18, 2014, the entire disclosure of which is hereby incorporated by this reference. For example, the metal cations 142 may react with a hypophosphate or with sodium borohydrite. In some embodiments, metal cations 142 may be reduced by high temperature reduction, ultraviolet assisted photocatalytic reduction, or chemical reduction.

The solvent may be removed from the partially coated particles 104 concurrently with or after deposition of the metal 116 on the partially coated particles 104. For example, the solvent may be removed by evaporation, filtration, etc., or by combinations of separation techniques. Once separated, the resulting partially coated particles 104 may be in the form of a powder, or may be processed to form a powder (e.g., by milling or grinding). The partially coated particles 104 may then be mixed with the polymer matrix 102 or a precursor thereof to form the thermoelectric material 100 shown in FIG. 1. The polymer matrix 102 may be formed into a selected shape (e.g., molded, extruded, cut, etc.) and may be cured to form the thermoelectric material 100 into a mass having selected properties.

Though the partially coated particles 104 are shown and described in FIGS. 2-4 as being graphene oxide, the partially coated particles 104 may also include other forms of carbon. In particular, carboxylated carbon nanotubes may be conceptualized as rolled graphene oxide sheets, and may therefore be processed in a similar manner. Other carbon-containing particles may also be used. Without being bound to any particular theory, it appears that materials having oxygen-abundant functional groups may be useful for the materials and methods described herein, due to their cation exchange and interaction capacities.

The carbon can be used as a host material to incorporate metallic nanoscale (largest diameter less than 1 μm) and microscale (largest diameter less than 500 μm) particles. Again without being bound to any particular theory, it appears that the presence of a large number of functional groups (hydroxyl, carboxyl, epoxy, etc.) decreases the ability of the particles to transfer electrons.

The partially coated particles 104 can effectively be used as a thermoelectric material because of several advantages. First, the non-connected portions of the metal 116 cause low or modest thermal conductivity in comparison to metals or fully metal-coated particles. Second, the partially coated particles 104 may have relatively high electrical conductivity due to electron transport between highly conductive metal 116 through the underlying carbon particle (e.g., the graphene sheet) if the particle is electrically conductive. Finally, when the partially coated particles 104 are embedded into a polymer matrix, the material may have a high Seebeck (or thermoelectric) coefficient.

For example, the thermoelectric material 100 may have a thermal conductivity of less than about $10^{-2}$ mW/cm·K, less than about $10^{-3}$ mW/cm·K, or even less than about $10^{-4}$ mW/cm·K. The thermoelectric material 100 may have an electrical conductivity of at least about 0.005 S/cm, at least about 0.007 S/cm, at least about 0.01 S/cm, or even at least about 0.02 S/cm. The thermoelectric material 100 disclosed herein may have a Seebeck coefficient of at least about 1000 μV/K, at least about 1500 μV/K, at least about 2000 μV/K, or even at least about 3000 μV/K.

Thermoelectric materials 100 as described herein may be used for a wide variety of applications. For example, thermoelectric materials 100 may be used in downhole tools to manage heat flow and protect electronic devices. Such uses are described further in U.S. Patent Application Publication 2008/0277162, "System and Method for Controlling Heat Flow in a Downhole Tool," published Nov. 13, 2008, the entire disclosure of which is incorporated herein by this reference.

Figure 5:
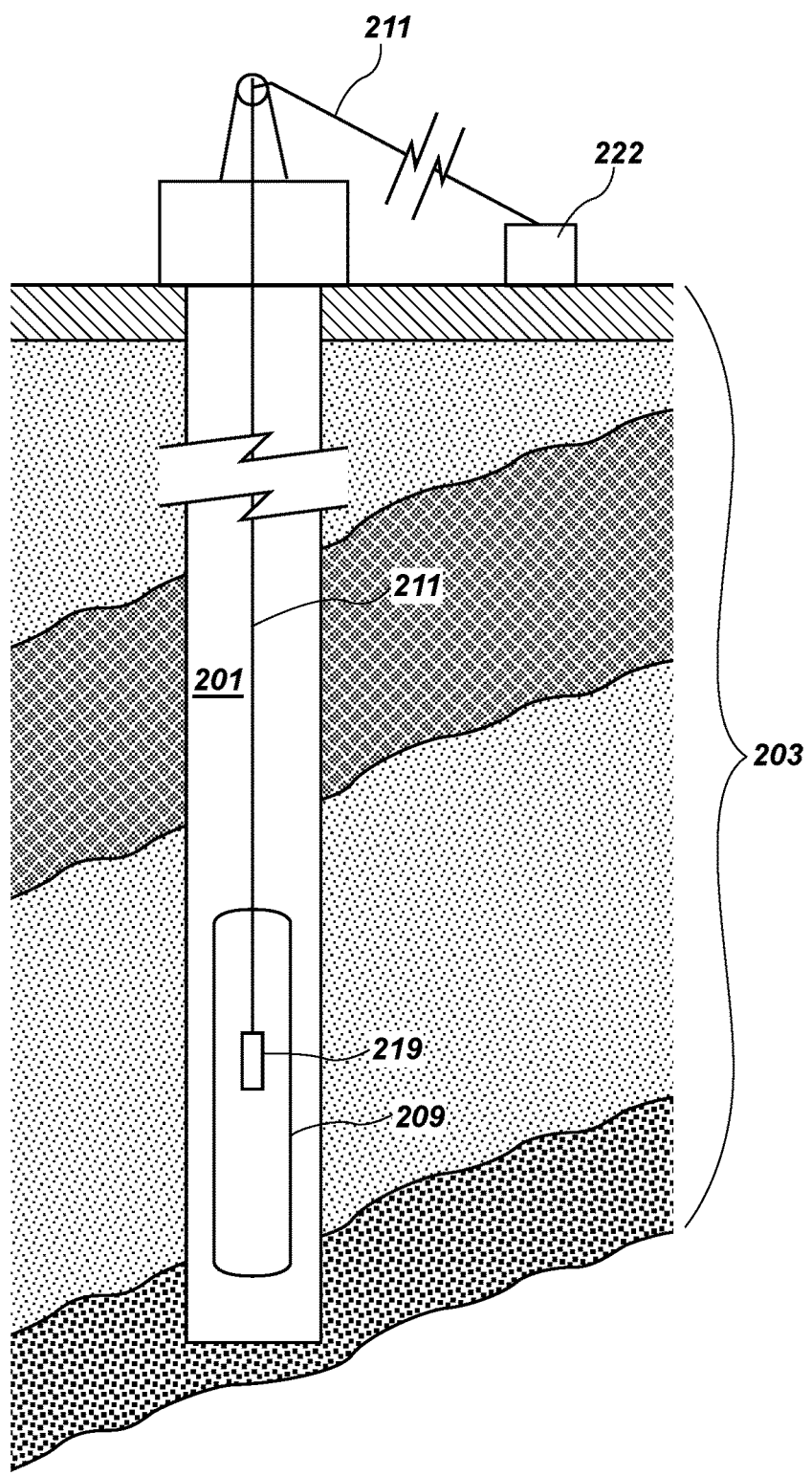
FIG. 5 is a simplified diagram illustrating an earth formation in which a tool having a thermoelectric material may be used.

For example, and as shown schematically in FIG. 5, a well bore 201 may extend into an earth formation, into which a logging tool including sensors and electronics has been lowered. The well bore 201 extends into an earth formation 203, which includes various layers. A tool 209 (which may be a cutting tool, a logging tool, etc.) having sensors and electronics 219 has been lowered into the well bore 201 via a wire line 211. The surface equipment 222 includes an electric power supply to provide electric power and a signal processor to receive and process electric signals from the sensors and electronics 219. Alternatively, a power supply and signal processor are located in the tool 209. In the case of the wire line deployment, the wire line 211 may be utilized for provision of power and data transmission.

Figure 6:
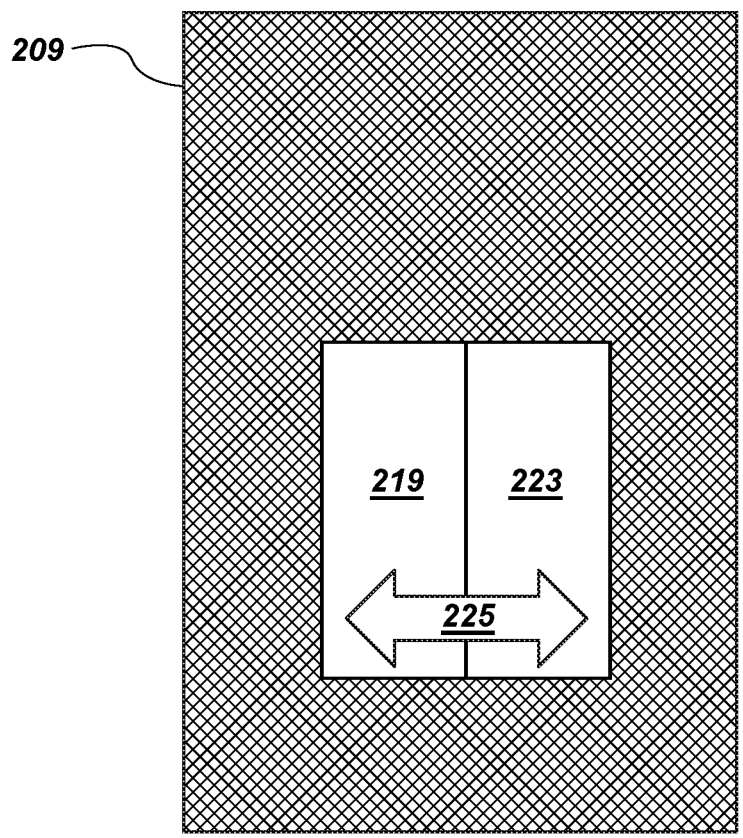
FIG. 6 is a simplified diagram illustrating the tool of FIG. 5 in more detail.

FIG. 6 illustrates that the tool 209 may include a thermoelectric device 223 (which may include the thermoelectric material 100 shown in FIG. 1). The electronics 219 may act as a heat source. Heat 225 may flow from the electronics 219 to the thermoelectric device 223 or vice versa to maintain the electronics 219 at a constant temperature. The thermoelectric device 223 may be electrically connected to a power source (e.g., the wire line 211 or a battery), which may drive the thermoelectric device 223 to transfer heat 225 from the electronics 219. Because the tool 209 may be used in harsh environments, the thermoelectric device 223 may be beneficial for increasing the useful life of the electronics 219. For example, the electronics 219 may be maintained at a temperature of about 150° C. or less.

Thermoelectric materials 100 may be formed in any selected size and shape, and therefore may be useful for a wide variety of applications in which conventional heat transfer devices are not suitable. For example, the thermoelectric material 100 may be formed in a sheet and wrapped around a sensitive component. In some embodiments, the thermoelectric material 100 may be placed on an inside wall of a body in which a sensitive component is placed. For example, the thermoelectric material 100 may be placed inside a tool body, and may help to maintain a temperature inside the tool body where electronics are located, even if the thermoelectric material 100 does not contact the electronics.

As another example, thermoelectric materials 100 may be used to control the temperature of electronic components (e.g., lasers, processors, memory, storage, etc.) for any application, such as laboratory equipment, computers, consumer electronics, etc. Thermoelectric materials 100 may also be used for cryogenic applications. In some embodiments, thermoelectric materials 100 may be used for power generation, such as in downhole devices.

Additional non limiting example embodiments of the disclosure are described below.

Embodiment 1

A thermoelectric material comprising a polymer matrix and a plurality of partially coated particles dispersed within the polymer matrix. Each particle of the plurality has a discontinuous coating of metal on a carbon-based material.

Embodiment 2

The thermoelectric material of Embodiment 1, wherein the discontinuous coating of metal comprises a metal selected from the group consisting of nickel, cobalt, copper, silver, platinum, palladium, chromium, tantalum, antimony, iron, tin, and gold.

Embodiment 3

The thermoelectric material of Embodiment 2, wherein the discontinuous coating of metal comprises a metal selected from the group consisting of nickel, cobalt, copper, and silver.

Embodiment 4

The thermoelectric material of any of Embodiments 1 through 3, wherein the plurality of partially coated particles comprises graphene oxide.

Embodiment 5

The thermoelectric material of any of Embodiments 1 through 4, wherein the plurality of partially coated particles comprises functionalized carbon nanotubes.

Embodiment 6

The thermoelectric material of any of Embodiments 1 through 5, wherein the polymer matrix comprises at least one material selected from the group consisting of polyether ether ketone (PEEK), polyethylene (PE), polyethylene terephthalate (PET), polyvinyl chloride (PVC), polyurethane (PU), and poly(methyl methacylate) (PMMA).

Embodiment 7

The thermoelectric material of any of Embodiments 1 through 6, wherein the thermoelectric material exhibits a figure of merit of at least 0.9.

Embodiment 8

A method comprising dispersing functionalized particles comprising a carbon-based material in a solvent; providing a metal salt in the solvent; and forming a plurality of distinct metal volumes on a surface of the functionalized particles to form partially coated particles. The distinct metal volumes are thermally insulated from other volumes of the plurality.

Embodiment 9

The method of Embodiment 8, further comprising dispersing the partially coated particles within a polymer.

Embodiment 10

The method of Embodiment 8 or Embodiment 9, wherein the functionalized particles comprise a material selected from the group consisting of functionalized carbon nanotubes and graphene oxide.

Embodiment 11

The method of any of Embodiments 8 through 10, further comprising oxidizing a carbon-based material to form the functionalized particles.

Embodiment 12

The method of any of Embodiments 8 through 11, further comprising reacting a metal of the metal salt with a surface of the functionalized particles.

Embodiment 13

The method of any of Embodiments 8 through 12, further comprising reducing a metal of the metal salt on the surface of the functionalized particles.

Embodiment 14

The method of any of Embodiments 8 through 13, further comprising removing the solvent from the partially coated particles after forming the plurality of distinct metal volumes on the surface of the functionalized particles.

Embodiment 15

The method of any of Embodiments 8 through 14, wherein the solvent comprises water.

Embodiment 16

The method of any of Embodiments 8 through 15, wherein dispersing functionalized particles in a solvent comprises subjecting the functionalized particles and the solvent to ultrasonic energy.

Embodiment 17

The method of any of Embodiments 8 through 16, further comprising forming a powder comprising the partially coated particles.

Embodiment 18

The method of any of Embodiments 8 through 17, wherein the functionalized particles comprise functional groups on the carbon-based material, wherein the metal salt comprises cations, and wherein the method further comprises adsorbing the cations to the functional groups.

Embodiment 19

The method of any of Embodiments 8 through 18, further comprising selecting the metal salt to comprise at least one salt selected from the group consisting of nitrates, sulfides, sulfates, sulfites, chlorides, bromides, chlorates, perchlorates, and phosphates.

Embodiment 20

The method of Embodiment 18, further comprising selecting the metal salt to comprise at least one salt selected from the group consisting of nitrates, sulfates, and chlorides.

Embodiment 21

The method of Embodiment 19, further comprising selecting the metal salt to comprise at least one salt selected from the group consisting of $NiCl_2$, $NiSO_4$, $CoCl_2$, $CoSO_4$, $Cu(NO_3)_2$, $AgNO_3$, and $AgCl$.

Embodiment 22

A composition of matter comprising a discontinuous coating of metal on a surface of a carbon-based material. The carbon-based material is selected from the group consisting of graphene oxide and functionalized carbon nanotubes.

Embodiment 23

The composition of Embodiment 22, wherein the discontinuous coating comprises a metal selected from the group consisting of nickel, cobalt, copper, silver, platinum, palladium, chromium, tantalum, antimony, iron, tin, and gold.

Embodiment 24

The composition of Embodiment 23, wherein the discontinuous coating comprises a metal selected from the group consisting of nickel, cobalt, copper, and silver.

Embodiment 25

The composition of any of Embodiments 22 through 24, wherein the discontinuous coating comprises a plurality of thermally insulated islands of metal over the surface.

Embodiment 26

The composition of any of Embodiments 22 through 25, wherein the composition exhibits a thermal conductivity of less than $10^{-2}$ mW/cm·K.

Embodiment 27

The composition of any of Embodiments 22 through 26, wherein the composition exhibits an electrical conductivity of at least 0.005 S/cm.

Embodiment 28

The composition of any of Embodiments 22 through 27, wherein the composition exhibits a Seebeck coefficient of at least 1000 µV/K.

While the present invention has been described herein with respect to certain illustrated embodiments, those of ordinary skill in the art will recognize and appreciate that it is not so limited. Rather, many additions, deletions, and modifications to the illustrated embodiments may be made without departing from the scope of the invention as hereinafter claimed, including legal equivalents thereof. In addition, features from one embodiment may be combined with features of another embodiment while still being encompassed within the scope of the invention as contemplated by the inventors. Further, embodiments of the disclosure have utility with different and various materials and formulations.

What is claimed is:

1. A thermoelectric material, comprising:
   a polymer matrix; and
   a plurality of partially coated particles comprising graphene oxide and dispersed within the polymer matrix, each particle of the plurality having a discontinuous coating of metal on a carbon-based material.

2. The thermoelectric material of claim 1, wherein the discontinuous coating of metal comprises a metal selected from the group consisting of nickel, cobalt, copper, and silver.

3. The thermoelectric material of claim 1, wherein the plurality of partially coated particles comprises functionalized carbon nanotubes.

4. The thermoelectric material of claim 1, wherein the discontinuous coating comprises a plurality of thermally insulated islands of metal over the carbon-based material.

5. The thermoelectric material of claim 1, wherein the thermoelectric material exhibits an electrical conductivity of at least 0.005 S/cm.

6. A thermoelectric material, comprising:
   a polymer matrix; and
   a plurality of coated particles dispersed within the polymer matrix, each particle of the plurality having a discontinuous coating of metal on a carbon-based material;
   wherein the thermoelectric material exhibits a figure of merit of at least 0.9.

7. A thermoelectric material, comprising:
   a polymer matrix; and
   a plurality of partially coated particles dispersed within the polymer matrix, each particle of the plurality having a discontinuous coating of metal on a carbon-based material;
   wherein the thermoelectric material exhibits a thermal conductivity of less than $10^{-2}$ mW/cm·K.

8. A thermoelectric material, comprising:
   a polymer matrix; and
   a plurality of partially coated particles dispersed within the polymer matrix, each particle of the plurality having a discontinuous coating of metal on a carbon-based material;
   wherein the thermoelectric material exhibits a Seebeck coefficient of at least 1000 µV/K.

* * * * *